United States Patent
Hashimoto

(10) Patent No.: US 7,968,380 B2
(45) Date of Patent: Jun. 28, 2011

(54) SEMICONDUCTOR ENCAPSULATION MATERIAL AND METHOD FOR ENCAPSULATING SEMICONDUCTOR USING THE SAME

(75) Inventor: Koichi Hashimoto, Otsu (JP)

(73) Assignee: Nippon Electric Glass Co., Ltd., Otsu-shi, Shiga (JP)

( * ) Notice: Subject to any disclaimer, the term of this patent is extended or adjusted under 35 U.S.C. 154(b) by 0 days.

(21) Appl. No.: 12/489,561

(22) Filed: Jun. 23, 2009

(65) Prior Publication Data

US 2009/0325349 A1    Dec. 31, 2009

(30) Foreign Application Priority Data

Jun. 25, 2008 (JP) ................... 2008-165700

(51) Int. Cl.
*H01L 21/00* (2006.01)
*C03C 3/076* (2006.01)
*C03C 3/089* (2006.01)

(52) U.S. Cl. ............... 438/127; 501/55; 501/65

(58) Field of Classification Search ............ None
See application file for complete search history.

(56) References Cited

U.S. PATENT DOCUMENTS

2003/0124774 A1*  7/2003  Kosokabe ............... 438/127
2006/0172875 A1*  8/2006  Cortright et al. ........ 501/15
2008/0128923 A1*  6/2008  Saito et al. ............. 257/794

FOREIGN PATENT DOCUMENTS

| JP | 2002-37641 | 2/2002 |
| JP | 2003-17632 | 1/2003 |
| WO | 2006-035882 | 4/2006 |

* cited by examiner

*Primary Examiner* — Scott B Geyer
(74) *Attorney, Agent, or Firm* — Drinker Biddle & Reath LLP

(57) ABSTRACT

A semiconductor encapsulation material of the present invention contains a glass for metal coating which has a strain point of 480° C. or higher, a temperature corresponding to a viscosity of $10^4$ dPa·s of 1,100° C. or lower, and a thermal expansion coefficient at 30 to 380° C. of $70 \times 10^{-7}$ to $110 \times 10^{-7}$/° C. The semiconductor encapsulation material of the present invention contains no environmentally harmful substances, has a heat resistance temperature as high as 500° C. or above, and can be used for the encapsulation of metals susceptible to oxidation, e.g., Dumet.

19 Claims, 1 Drawing Sheet

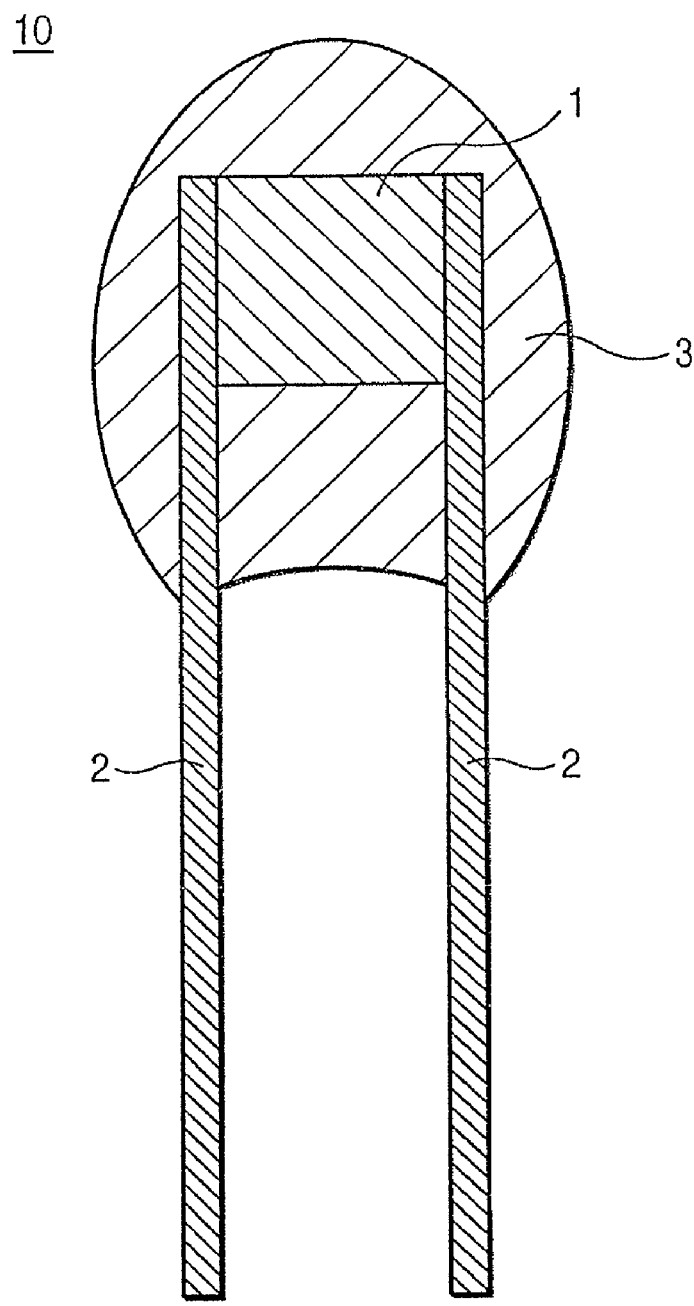
Prior Art

SEMICONDUCTOR ENCAPSULATION MATERIAL AND METHOD FOR ENCAPSULATING SEMICONDUCTOR USING THE SAME

FIELD OF THE INVENTION

The present invention relates to a semiconductor encapsulation material and a method for semiconductor encapsulation using the same.

BACKGROUND OF THE INVENTION

Thermistors, diodes, and the like are known as encapsulated-semiconductor parts. A thermistor, for example, is an encapsulated-semiconductor part in which the semiconductor has the property of changing in electrical resistance with increasing temperature. By taking advantage of this property and measuring the electrical resistance of the semiconductor, temperature can be determined with the part.

In particular, as shown in the sole prior art FIGURE, a thermistor 10 called a bead thermistor or glass thermistor includes a semiconductor (thermistor chip) 1, lead wires 2, and a semiconductor encapsulation material 3. The thermistor chip 1 and part of the lead wires 2 have been coated and encapsulated with the semiconductor encapsulation material (glass for metal coating) 3, so that the thermistor 10 can be used at high temperatures and in oxidizing atmospheres. Examples of the thermistor chip 1 include oxide materials and non-oxide materials constituted of at least one member selected from the group consisting of nitrides, carbides, borides, and silicides, and oxide materials are in extensive use mainly from the standpoint of properties or cost. As the lead wires 2, Dumet wires (Fe—Ni alloy coated with Cu) and the like are used.

Such a glass for metal coating is required to satisfy, for example, the following: (1) to have a thermal expansion coefficient which matches with those of the lead wires and semiconductor chip so that the encapsulation of the lead wires and the semiconductor chip does not result in cracking; (2) to be usable in encapsulation at a temperature lower than the heat resistance temperature of the lead wires; and (3) not to contain any harmful substance, e.g., lead.

Hitherto, borosilicate glasses have been proposed as glasses for metal coating which meet such requirements (see, for example, JP-A-2002-37641 and JP-A-2003-17632). Furthermore, an aluminosilicate glass (e.g., WO 2006/35882) has been proposed as an encapsulation glass for thermistors to be used at high temperatures.

In recent years, a heat source in, e.g., a building or the combustion system of a power generator have been required to be kept in an optimal operating state in order to minimize $CO_2$ or $NO_x$, emission in environmental measures for carbon dioxide reduction and acid rain prevention or from the standpoint of ensuring safety. For optimizing the state in which a gas, oil, or the like burns in the heat source or combustion system, it is necessary to directly monitor the temperature in the combustion chamber and automatically control the heat source or combustion system. The thermistors to be used in this application must have a heat resistance temperature of about 600° C.

However, since glass thermistors employing the glasses described in JP-A-2002-37641 and JP-A-2003-17632 have low heat resistance and these glasses for metal coating soften or deform upon exposure to an atmosphere of 500 to 600° C., these glasses cannot hence be used in such applications.

On the other hand, the glass for metal coating described in WO 2006/35882 has been designed to be applied to lead wires made of platinum, and encapsulation therewith is conducted at a temperature as high as above 1,000° C. Because of this, when a metal susceptible to oxidation, e.g., Dumet, is used as lead wires, the lead wires are oxidized to form a brittle oxide on the surface thereof. This oxide is apt to be peeled off from the metal and, hence, the encapsulated part readily deteriorates. Consequently, such metals cannot be used.

SUMMARY OF THE INVENTION

The invention has been achieved in view of those circumstances. An object of the invention is to provide a semiconductor encapsulation material constituted of a glass for metal coating which contains no environmentally harmful substances, has a heat resistance temperature as high as 500° C. or above, and can be used for the encapsulation of metals susceptible to oxidation, e.g., Dumet.

The present invention provides a semiconductor encapsulation material comprising a glass for metal coating which has a strain point of 480° C. or higher, a temperature corresponding to a viscosity of $10^4$ dPa·s of 1,100° C. or lower, and a thermal expansion coefficient at 30 to 380° C. of $70 \times 10^{-7}$ to $110 \times 10^{-7}$/° C.

The term "strain point" in the invention means a temperature determined by the method conducted in accordance with ASTM C336. Strain point is a measure of heat resistance, and the higher the temperature is, the higher the heat resistance temperature is. The term "temperature corresponding to a viscosity of $10^4$ dPa·s" means a temperature determined from a viscosity curve obtained by determining the strain point, annealing point, and softening point of the glass by the fiber method in accordance with ASTM C336 and C338, determining a temperature corresponding to a viscosity region around $10^3$ dPa·s by the platinum ball pulling-up method, and substituting these found values into the Fulcher equation. The temperature corresponding to a viscosity of $10^4$ dPa·s is a temperature serving as an index to metal coating (encapsulation) temperature. The lower the temperature is, the more the glass is effective in inhibiting metal oxidation. The term "thermal expansion coefficient" means a value determined with a thermodilatometer.

In the semiconductor encapsulation material of the present invention, the glass for metal coating is preferably composed of an $SiO_2$—$B_2O_3$—RO—$R'_2O$ glass in which R is one or more members selected from Mg, Ca, Sr, and Ba; and R' is one or more members selected from Li, Na, and K.

Herein, the term $SiO_2$—$B_2O_3$—RO—$R'_2O$ glass means a glass which contains $SiO_2$, $B_2O_3$, RO, and $R'_2O$ as essential components and in which the total content of these components is at least 55% by mole.

When this composition system is employed, a glass having the following properties can be easily designed: a strain point of 480° C. or higher, a temperature corresponding to a viscosity of $10^4$ dPa·s of 1,100° C. or lower, and a thermal expansion coefficient at 30 to 380° C. of $70 \times 10^{-7}$ to $110 \times 10^{-7}$/° C.

In the semiconductor encapsulation material of the present invention, the content of $B_2O_3$ in the glass for metal coating is preferably 3% by mole or higher.

According to this constitution, it is easy to lower the temperature corresponding to $10^4$ dPa·s (i.e., to render the glass short) while maintaining a strain point.

In the semiconductor encapsulation material of the present invention, the content of RO in the glass for metal coating is preferably 10% by mole or higher.

According to this constitution, it is easy to lower the temperature corresponding to $10^4$ dPa·s (i.e., to render the glass short) while maintaining a strain point.

In the semiconductor encapsulation material of the present invention, the content of $R'_2O$ in the glass for metal coating is preferably 1 to 20% by mole.

According to this constitution, a heightened strain point can be easily attained.

In the semiconductor encapsulation material of the present invention, the content of $Li_2O$ in the glass for metal coating is preferably 6% by mole or lower.

According to this constitution, a heightened strain point can be easily attained.

In the semiconductor encapsulation material of the present invention, the content of $K_2O$ in the glass for metal coating is preferably 2% by mole or higher.

According to this constitution, it is easy to obtain a thermal expansion coefficient suitable to Dumet or the like.

Furthermore, the present invention provides a semiconductor encapsulation material comprising a glass for metal coating which comprises, in terms of % by mole, 40 to 75% of $SiO_2$, 0 to 8% of $Al_2O_3$, 3 to 21% of $B_2O_3$, 15 to 45% of RO (wherein R is one or more members selected from Mg, Ca, Sr, and Ba), 0 to 20% of MgO, 0 to 20% of CaO, 0 to 35% of SrO, 0 to 35% of BaO, 1 to 20% of $R'_2O$ (wherein R' is one or more members selected from Li, Na, and K), 0 to 6% of $Li_2O$, 0 to 12% of $Na_2O$, and 2 to 15% of $K_2O$.

In the glass for metal coating which constitutes the semiconductor encapsulation material of the present invention, it is preferable that the content of $K_2O$ is highest among the contents of the $R'_2O$ components in the glass for metal coating.

According to this constitution, it is easy to obtain a thermal expansion coefficient suitable to Dumet or the like.

In the glass for metal coating which constitutes the semiconductor encapsulation material of the present invention, it is preferable that the content of $Li_2O$ is lowest among the contents of the $R'_2O$ components in the glass for metal coating.

According to this constitution, a heightened strain point can be easily attained.

In the semiconductor encapsulation material of the present invention, the glass for metal coating is preferably a glass for coating base metal. The term "base metal" in the invention means a metal which is readily oxidized in air and indicates metals other than gold, silver, and the platinum-group metals and of alloys of these metals.

According to this constitution, since the use of the glass of the invention enables coating (encapsulation) to be conducted at a temperature lower than the temperatures at which base metals are oxidized, a merit of the invention can be sufficiently acquired.

In the semiconductor encapsulation material of the invention, it is preferred that the glass for metal coating should be one for Dumet coating.

According to this constitution, since the use of the glass of the invention enables coating (encapsulation) to be conducted at a temperature lower than the temperatures at which Dumet is oxidized, a merit of the invention can be acquired to the highest degree. In addition, since this constitution enables the use of Dumet, which is inexpensive, it is easy to reduce the cost of materials for, e.g., encapsulated-semiconductor parts to be produced.

The semiconductor encapsulation material of the invention can be used for the encapsulation of a semiconductor element and a metallic lead wire.

In the invention, it is preferred to use a lead wire made of a base metal.

According to this constitution, since the lead wire can be encapsulated at a temperature lower than the temperatures at which the base metal is oxidized, a merit of the invention can be sufficiently acquired.

In the invention, it is preferred to use a lead wire made of Dumet.

According to this constitution, since the lead wire can be encapsulated at a temperature lower than the temperatures at which Dumet is oxidized, a merit of the invention can be acquired to the highest degree. In addition, it is easy to reduce the cost of members (lead wires) for encapsulated-semiconductor parts.

In the invention, a thermistor chip may be used as the semiconductor element.

Furthermore, the present invention provides a method for semiconductor encapsulation which comprises encapsulating a semiconductor element and a metallic lead wire with the above-mentioned semiconductor encapsulation material.

In the method for semiconductor encapsulation of the present invention, the lead wire is preferably made of a base metal.

In the method for semiconductor encapsulation of the present invention, the lead wire is preferably made of Dumet.

In the method for semiconductor encapsulation of the present invention, the semiconductor element is preferably a thermistor chip.

According to the method for semiconductor encapsulation of the present invention, the encapsulation can be conducted at a temperature of 1,000° C. or lower.

The glass for metal coating to be used in the invention contains no environmentally harmful substances. Further, since metal encapsulation can be conducted at temperatures of 1,000° C. or lower, even a metal susceptible to oxidation, such as Dumet, can be satisfactorily coated (encapsulated). In addition, this glass has a heat resistance temperature of 500° C. or higher. Consequently, the glass for metal coating is suitable for use as an encapsulation glass for producing encapsulated-semiconductor parts which employ lead wires made of a base metal, e.g., Dumet, and are required to have heat resistance.

The semiconductor encapsulation material of the invention is constituted of the glass for metal coating described above and is hence suitable for use as an encapsulation material for producing encapsulated-semiconductor parts, e.g., thermistors, which employ lead wires made of a base metal, e.g., Dumet, and are required to have heat resistance.

BRIEF DESCRIPTION OF THE DRAWING

The prior art FIGURE is a view illustrating a thermistor.

DESCRIPTION OF SYMBOLS

1 semiconductor chip (thermistor chip)
2 lead wire
3 semiconductor encapsulation material (glass for metal coating)
10 thermistor

DETAILED DESCRIPTION OF THE INVENTION

The glass for metal coating constituting the semiconductor encapsulation material of the invention (hereinafter referred to also as "glass for metal coating of the invention") is explained below.

The glass for metal coating of the invention has a strain point (Ps) of 480° C. or higher. The higher the strain point is, the more the glass is preferred from the standpoint of heat resistance. When the glass has a strain point of 480° C. or higher, a heat resistance in continuous use of 500° C. can be obtained. When the strain point thereof is 500° C. or higher, in particular, 530° C. or higher, a higher heat resistance in continuous use can be obtained or this glass enables the encapsulated-semiconductor part to be more safely used at 500° C.

The glass for metal coating of the invention has a temperature corresponding to a viscosity of $10^4$ dPa·s ($T(10^4)$) of 1,100° C. or lower. Metal coating or encapsulation is conducted at a temperature corresponding to a viscosity of $10^4$ to $10^5$ dPa·s. In the invention, the temperature corresponding to a viscosity of $10^4$ dPa·s is employed as an index to suitability therefor. The lower the temperature corresponding to a viscosity of $10^4$ dPa·s is, the more the glass is preferred from the standpoint of preventing metal oxidation. When the temperature at $10^4$ dPa·s is 1,100° C. or lower, metals can be coated or encapsulated at a temperature of 1,000° C. or lower in actual production. Accordingly, even when base metals are coated or encapsulated, the metals can be inhibited from being oxidized so long as the coating or encapsulation is completed in a short time period. Furthermore, when the temperature corresponding to a viscosity of $10^4$ dPa·s is 1,050° C. or lower, the necessity of regulating the atmosphere, e.g., $N_2$ blowing, is eliminated. When the temperature corresponding to a viscosity of $10^4$ dPa·s is 1,000° C. or lower, in particular, 980° C. or lower, the prevention of metal oxidation can be attained with higher certainty even in air or this glass is advantageous from the standpoints of the rate of production of encapsulated-semiconductor parts and the regulation of the burning atmosphere. Furthermore, since even a metal which is highly susceptible to oxidation can be coated or encapsulated, there is a wider choice of lead wire materials.

The glass for metal coating of the invention has a thermal expansion coefficient at 30 to 380° C. ($\alpha_{30-380}$) of $70 \times 10^{-7}$ to $110 \times 10^{-7}$/° C. When the thermal expansion coefficient thereof is within that range, this thermal expansion coefficient matches with the thermal expansion coefficients of metals such as Dumet, Kovar, Alloy 42, Alloy 47, and 52 Fe—Ni alloy, and these metals can be compression-sealed with the glass, so that these metals can be coated or encapsulated with the glass. Moreover, when the thermal expansion coefficient of the glass is within the range of $75 \times 10^{-7}$ to $100 \times 10^{-7}$/° C., semiconductor elements such as thermistors can be sealed with the glass regardless of the size of the semiconductor elements. With taking the coating or encapsulation of Dumet into consideration, it is desirable that the thermal expansion coefficient of the glass is within the range of $80 \times 10^{-7}$ to $95 \times 10^{-7}$/° C.

It is preferred that the glass for metal coating of the invention be one in which the difference between the temperature corresponding to a viscosity of $10^4$ dPa·s and the strain point ($T(10^4)$-Ps) is 500° C. or smaller. The smaller the difference in temperature is, the more the viscosity of the glass decreases rapidly. Namely, smaller values of the temperature difference mean that the glass is short. When the glass is short, a shorter heating time suffices for heating to a burning temperature and this glass comes at a lower temperature to have viscosity which renders coating or encapsulation possible. Consequently, burning is less apt to result in metal oxidation. In particular, in the case where a metal susceptible to oxidation, such as Dumet, is to be coated or encapsulated, it is desirable that the temperature difference be 450° C. or smaller, especially 400° C. or smaller.

In application to thermistors or the like, the following trouble may arise. In case where the glass has reduced volume resistivity and a current flows from a lead wire through the glass, this encapsulated-semiconductor part comes into such a state that another resistor has been inserted parallel to the thermistor element, resulting in a possibility that measured values of the resistance of the thermistor element might include errors. Because of this, when application to thermistors or the like is taken into account, it is preferred that the volume resistivity of the glass for metal coating of the invention be higher. Specifically, it is preferred that the volume resistivity of the glass as measured at 350° C. (Ω-cm) be 7 or higher, desirably 8 or higher, especially 8.5 or higher, optimally 9 or higher, in terms of Log.

A glass having the properties described above can be attained with any of various composition systems. However, it is desirable to select a $SiO_2$—$B_2O_3$—RO—$R'_2O$ glass (in which R is one or more members selected from Mg, Ca, Sr, and Ba; and R' is one or more members selected from Li, Na, and K) because of a high degree of freedom of composition design, etc. In the following explanation, "%" means "% by mole" unless otherwise indicated.

In the $SiO_2$—$B_2O_3$—RO—$R'_2O$ glass, for lowering the temperature corresponding to $10^4$ dPa·s while maintaining a strain point (i.e., for making the glass short), it is preferred to regulate the content of $B_2O_3$ to 3% or higher (especially 5% or higher, desirably 7% or higher) and/or to regulate the total content of RO to 10% or higher (especially 15% or higher, desirably 20% or higher). In case where it is attempted to lower the temperature corresponding to $10^4$ dPa·s without adding $B_2O_3$ or RO, the strain point also is apt to become lower simultaneously. It is preferred that the upper limit of the content of $B_2O_3$ be 21% or lower (especially 18% or lower, desirably 14% or lower) and that the upper limit of the total content of RO be 45% or lower (especially 40% or lower, desirably 35% or lower).

Furthermore, in the $SiO_2$—$B_2O_3$—RO—$R'_2O$ glass, for heightening the strain point, it is preferred to regulate the total content of $R'_2O$ to 20% or lower (especially 16% or lower, desirably 12% or lower) and/or to regulate the content of $Li_2O$ to 6% or lower (especially 3% or lower, desirably 1% or lower). $R'_2O$ serves to reduce the viscosity of the glass, so that too high a total content of $R'_2O$ results in a decrease in strain point. Among the $R'_2O$ components, $Li_2O$ is highly effective in lowering strain point. Too high a content of $Li_2O$ hence results in difficulties in heightening strain point. For this reason, it is desirable that the glass contain no $Li_2O$.

Moreover, in the $SiO_2$—$B_2O_3$—RO—$R'_2O$ glass, for obtaining a thermal expansion coefficient which is suitable for Dumet or the like, it is preferred to regulate the total content of $R'_2O$ to 1% or higher (especially 3% or higher, desirably 5% or higher) and/or to regulate the content of $K_2O$ to 2% or higher (especially 3% or higher). $R'_2O$ has the effect of enhancing the expansion of the glass. $K_2O$, among the $R'_2O$ components, is the highest in the effect of enhancing glass expansion. Consequently, in case where the content of these components is too low, it is difficult to obtain a thermal expansion coefficient suitable for Dumet or the like. It is preferred that the upper limit of the content of $K_2O$ be 15% or lower (especially 12% or lower, desirably 10% or lower).

Examples of more preferred compositions of the $SiO_2$—$B_2O_3$—RO—$R'_2O$ glass include a glass which includes, in terms of % by mole, 40 to 75% of $SiO_2$, 0 to 8% of $Al_2O_3$, 3 to 21% of $B_2O_3$, 10 to 45% of RO (in which R is one or more members selected from Mg, Ca, Sr, and Ba), 0 to 20% of MgO, 0 to 20% of CaO, 0 to 35% of SrO, 0 to 35% of BaO, 1 to 20% of R'$_2$O (in which R' is one or more members selected from Li, Na, and K), 0 to 6% of Li$_2$O, 0 to 12% of Na$_2$O, and 2 to 15% of K$_2$O.

The reasons for restricting the content of each component as shown above are as follows.

SiO$_2$ is a component necessary for constituting a glass framework. The content thereof is 40% or higher, preferably 45% or higher, more preferably 50% or higher, Additionally, the content thereof is 75% or lower, preferably 70% or lower, more preferably 65% or lower, even more preferably 60% or lower. When the content of SiO$_2$ is 75% or lower, it is possible to reduce the temperature difference between the temperature corresponding to 10$^4$ dPa·s and the strain point. When the content thereof is 70% or lower, 65% or lower, especially 60% or lower, this facilitates the incorporation of a component having the effect of heightening strain point. On the other hand, when the content of SiO$_2$ is 40% or higher, it is possible to obtain the heat resistance necessary for applications such as thermistors. When the content thereof is 45% or higher, it is easy to obtain a stable glass in which crystals are less apt to generate. When the content thereof is 50% or higher, it is possible to obtain high heat resistance, weatherability, etc. and this glass enables highly reliable encapsulated-semiconductor parts to be produced even in a severe environment, such as a combustion atmosphere in which NO$_x$, SO$_x$, etc. are present.

Al$_2$O$_3$ has the effects of heightening the strength of the glass network cut by the addition of alkali metal components R'O and of mitigating the devitrification of the glass in a molten state. Al$_2$O$_3$, on the other hand, increases the viscosity of the glass and, hence, is a component which disadvantageously heightens the temperature corresponding to 10$^4$ dPa·s. The content of Al$_2$O$_3$ is 8% or lower, preferably 5% or lower, more preferably 3% or lower. From the standpoint of lowering the temperature corresponding to 10$^4$ dPa·s (and thereby reducing the temperature difference between the temperature corresponding to 10$^4$ dPa·s and the strain point), it is preferred to minimize the content of Al$_2$O$_3$. However, from the standpoints of glass homogenization and forming stabilization, it is preferred to incorporate Al$_2$O$_3$ in an amount of 0.1% or larger.

B$_2$O$_3$ has the effect of lowering the temperature corresponding to 10$^4$ dPa·s without considerably lowering strain point. Furthermore, B$_2$O$_3$ is a component added for the purposes of improving meltability, stability, and weatherability and regulating thermal expansion coefficient. The content thereof is 3% or higher, preferably 5% or higher, more preferably 7% or higher. In addition, it is 21% or lower, preferably 18% or lower, more preferably 14% or lower. When the content of B$_2$O$_3$ is 3% or higher, it is possible to produce those effects, in particular, the effect of lowering the temperature corresponding to 10$^4$ dPa·s without lowering strain point. When the content thereof is 5% or higher, the glass has enhanced stability and this diminishes limitations to be imposed on forming methods. When the content thereof is 7% or higher, this glass is highly stable and, hence, can be easily mass-produced. On the other hand, in case where the content of B$_2$O$_3$ exceeds 21%, a decrease in strain point is apt to result. However, when the content thereof is 18% or lower, especially 14% or lower, a high strain point can be maintained.

RO (R is one or more members selected from Mg, Ca, Sr, and Ba) has the effects of heightening the strain point of the glass and lowering the temperature corresponding to 10$^4$ dPa·s. RO further has the effect of increasing volume resistivity. The total content thereof is 10% or higher, preferably 15% or higher, more preferably 20% or higher. In addition, it is 45% or lower, preferably 40% or lower, more preferably 35% or lower. When the total content of RO is 10% or higher, the above-mentioned effects, in particular, the effects of heightening the strain point of the glass and lowering the temperature corresponding to 10$^4$ dPa·s are produced. When the total content of RO is 15% or higher, a higher strain point can be obtained. When the total content thereof is 20% or higher, volume resistivity in a high-temperature region can be further increased. On the other hand, when the total content of RO is 45% or lower, especially 40% or lower, the generation of crystals of alkaline earth metals can be effectively inhibited. When the total content thereof is 35% or lower, crystal generation is further inhibited and this diminishes limitations to be imposed on production apparatus.

MgO has the effect of tightening the glass structure to improve weatherability, besides the effects described above. It is, however, noted that too high contents of MgO are apt to result in devitrification. The content thereof is 20% or lower, preferably 15% or lower, more preferably 12% or lower. When the content of MgO is 20% or lower, especially 15% or lower, crystals are less apt to generate during forming. When the content thereof is 12% or lower, crystal generation is further inhibited and this diminishes limitations to be imposed on production apparatus.

CaO has the effect of tightening the glass structure to improve stability, besides the effects described above. It is, however, noted that too high contents of CaO are apt to result in devitrification. The content thereof is 20% or lower, preferably 15% or lower, more preferably 10% or lower. When the content of CaO is 20% or lower, especially 15% or lower, crystals are less apt to generate during forming. When the content thereof is 10% or lower, crystal generation is further inhibited and this diminishes limitations to be imposed on production apparatus.

SrO has the effect of stabilizing the glass besides the effects described above. Because of the large atomic radius, SrO can reduce the size of interstices present in the glass structure. SrO is hence highly effective in inhibiting the movement of alkali metal components and thereby heightening the volume resistivity of the glass. It is, however, noted that too high contents of SrO are apt to result in devitrification. Although SrO is an optional component, it is preferred that SrO be contained in an amount of 1% or larger, especially 4% or larger, more preferably 5% or larger. The content of SrO is 35% or lower, preferably 15% or lower, more preferably 10% or lower. When the content of SrO is 35% or lower, especially 15% or lower, crystals are less apt to generate during forming. When the content thereof is 10% or lower, crystal generation is further inhibited and this diminishes limitations to be imposed on production apparatus.

BaO has the effect of stabilizing the glass besides the effects described above. Because of the large atomic radius, BaO can reduce the size of interstices present in the glass structure. BaO is hence highly effective in inhibiting the movement of alkali metal components and thereby heightening the volume resistivity of the glass. It is, however, noted that too high contents of BaO are apt to result in devitrification. Although BaO is an optional component, it is preferred that BaO should be contained in an amount of 1% or larger, especially 4% or larger, more preferably 5% or larger. The content of BaO is 35% or lower, preferably 15% or lower, more preferably 10% or lower. When the content of BaO is 35% or lower, especially 15% or lower, crystals are less apt to generate during forming. When the content thereof is 10% or lower, crystal generation is further inhibited and this diminishes limitations to be imposed on production apparatus.

R'$_2$O (R' is one or more members selected from Li, Na, and K) serves to heighten the thermal expansion coefficient of the glass and further has the effect of lowering the temperature corresponding to $10^4$ dPa·s. R'$_2$O furthermore has the effects of improving meltability to enhance glass homogeneity and inhibiting formed articles from having impaired dimensional accuracy due to a melting residue, etc. R'$_2$O, on the other hand, serves to lower the temperature of the glass. Consequently, in case where R'$_2$O is contained in a large amount, it is difficult to ensure sufficient heat resistance. R'$_2$O functions also as a component which reduces the volume resistivity of the glass and reduces the weatherability of the glass. It is therefore important to regulate the total content of R'$_2$O so as to be in a proper range. The total content of R'$_2$O is 1% or higher, preferably 3% or higher, more preferably 5% or higher. In addition, it is 20% or lower, preferably 16% or lower, more preferably 12% or lower. When the total content of R'$_2$O is 1% or higher, a thermal expansion coefficient matching with those of metals such as Dumet can be obtained and glass meltability can be improved. When the total content thereof is 3% or higher, a thermal expansion coefficient of $70 \times 10^{-7}/°$ C. or higher can be obtained. In particular, when the total content thereof is 5% or higher, this glass can be reduced in the temperature corresponding to $10^4$ dPa·s. On the other hand, when the total content thereof is 20% or lower, the glass is prevented from having too low a strain point and, hence, necessary heat resistance can be obtained. When the total content thereof is 16% or lower, it is easy to attain a sufficiently high volume resistivity. When the total content thereof is 12% or lower, various effects can be obtained with a satisfactory balance among these and it is easy to produce a comprehensively excellent glass.

It is preferred that two or more R'$_2$O components be incorporated for the purposes of improving volume resistivity and preventing crystal precipitation.

Li$_2$O is a component capable of producing the effects described above. However, Li$_2$O has a drawback that this component is highly effective in reducing the viscosity of the glass and this disadvantageously results in a considerable decrease in strain point. The content thereof is 6% or lower, preferably 3% or lower. When given properties such as meltability, expansion characteristics, and viscosity characteristics can be obtained by using the other R'$_2$O components (i.e., Na$_2$O and K$_2$O) or other components, it is desirable to avoid the incorporation of Li$_2$O if possible. For the same reason, the content of Li$_2$O must be regulated so as to be lowest among those of the R'$_2$O components.

The upper limit of the content of Na$_2$O is 12% or lower, preferably 7% or lower, more preferably 4% or lower. When the content of Na$_2$O is 12% or lower, a practically sufficient volume resistivity can be ensured. Contents thereof not higher than 8% are preferred also from the standpoint of weatherability. When the content thereof is 4% or lower, it is easy to obtain a high strain point. Although Na$_2$O is an optional component, it is preferred to use Na$_2$O in combination with K$_2$O especially when Li$_2$O is not contained. Use of those two components in combination is exceedingly advantageous for improving volume resistivity or preventing crystal precipitation. In such a case, it is preferred that the content of Na$_2$O be 1% or higher, especially 2% or higher.

K$_2$O is a component which is least effective in lowering strain point among the R$_2$O components. Compared to Li ions and Na ions, K ions have a larger ionic radius and are less apt to move in the glass. Because of this, the higher the content of K$_2$O is, the more the volume resistivity in a high-temperature region can be heightened. For such reasons, when R'$_2$O components are added in order to obtain given properties such as meltability, expansion characteristics, and viscosity characteristics, the content of K$_2$O must be regulated so as to be highest among those of the R'$_2$O components. The content thereof is 2% or higher, preferably 3% or higher, more preferably 4% or higher. In addition, it is 15% or lower, preferably 12% or lower, more preferably 10% or lower. When the content of K$_2$O is 2% or higher, especially 3% or higher, those effects can be obtained. When the content thereof is 4% or higher, various effects can be obtained with a satisfactory balance among these and it is easy to produce a comprehensively excellent glass. With respect to balance with the other alkalis, it is desirable that K$_2$O/R'$_2$O be 0.5 or larger, preferably 0.6 or larger, more preferably 0.7 or larger. This is because when K$_2$O is used in such a proportion, electrical resistance can be increased and strain point can be heightened.

Besides the components described above, various ingredients can be added.

For example, ZnO can be added for the purpose of improving the meltability of the glass, inhibiting the formation of crystals to stabilize the glass, or reducing the viscosity of the glass. It is, however, noted that ZnO tends to lower strain point and that ZnO itself is a component which readily volatilizes. Therefore, it is preferred that the content thereof be 15% or lower, especially 10% or lower, desirably 5% or lower.

ZrO$_2$ can be added for the purpose of heightening strain point or improving chemical durability. The amount of ZrO$_2$ to be added is preferably 0.1% or larger. It is, however, noted that ZrO$_2$ is a component which renders the glass highly viscous and, hence, disadvantageously heightens the temperature corresponding to $10^4$ dPa·s. Therefore, it is preferred that the content thereof be 10% or lower, especially 5% or lower, more desirably 3% or lower.

TiO$_2$ and P$_2$O$_5$ can be added for the purpose of improving the stability of the glass. The amount of each of these ingredients to be added is preferably 0 to 10%.

Nb$_2$O$_5$, WO$_3$, and Ta$_2$O$_5$ can be incorporated each in an amount of up to 10% for the purpose of increasing the viscosity of the glass.

Fe$_2$O$_3$ is an ingredient which unavoidably comes into the glass from raw glass materials. However, in case where the amount of Fe$_2$O$_3$ is too large, it absorbs heat rays to improperly heighten the temperature of the glass. Care should hence be taken in the case of thermistor applications, in which the glass is apt to be influenced by infrared rays. For preventing the absorption of heat rays, it is preferred to regulate the content of Fe$_2$O$_3$ to 1,000 ppm or lower, preferably 300 ppm or lower. In the case where it is desired to absorb infrared rays to heighten temperature, that Fe$_2$O$_3$ content regulation does not apply and it is possible to incorporate about 2 to 5% Fe$_2$O$_3$ so as to replace part of the SiO$_2$ therewith.

As a fining agent, various ingredients are usable, such as Sb$_2$O$_3$, SnO$_2$, CeO$_2$, Cl, F, and SO$_3$. Refining with reducing agents also may be employed. Sb$_2$O$_3$ is especially suitable for the refining of this glass system. When Sb$_2$O$_3$ is incorporated in an amount not smaller than 0.0001%, a refining effect comes to be produced. However, when the content thereof is 0.001% or higher, especially 0.1% or higher, there is a surplus in the refining ability and mass-production is easy. It is preferred that the content of Sb$_2$O$_3$ should be 5% or lower, especially 3% or lower. CeO$_2$ also shows a desirable refining function. CeO$_2$ produces the effect when contained in an amount of 0.01% or higher, and the content thereof is desirably 3%.

As described above, various ingredients can be added to the glass of the invention. From the standpoint of concern for the environment, however, it is desirable that the glass contain substantially none of $As_2O_3$, PbO, and the like. The term "substantially" means that the content of such ingredients in the glass, including the unavoidable impurities, is substantially 0.1% or lower.

The semiconductor encapsulation material of the invention is constituted of a glass for metal coating which has the properties and/or composition described above.

A process for producing the semiconductor encapsulation material of the invention is explained below. In the following explanation, a process for producing a tubular encapsulation material (outer glass tube) is explained as an example.

The process for producing the encapsulation material in an industrial scale includes: a mixing step in which minerals or purified crystal powders containing glass-forming ingredients are weighed and mixed together to prepare a raw material to be charged into a furnace; a melting step in which the raw material is melted and vitrified; a forming step in which the molten glass is formed into a tube shape; and a processing step in which the tube is cut into a given size.

First, raw glass materials are mixed. Raw materials include minerals each constituted of components such as oxides and carbonates as well as impurities, and may be mixed together while taking account of analytical data. The raw materials are not limited. These are weighed and mixed together by means of an appropriate mixer suitable for the scale, such as a V mixer, rocking mixer, or mixer equipped with stirring blades, to obtain a charge raw material.

Subsequently, the raw material is charged into a glass-melting furnace and vitrified. The melting furnace includes a melter tank for melting and vitrifying raw glass materials, a fining agent for causing bubbles present in the glass to ascend and thereby removing the bubbles, and a feeder for lowering the viscosity of the refined glass to a value suitable for forming and leading this glass to a forming apparatus. As the melting furnace, use is made of a refractory furnace or a furnace the inside of which is covered with platinum. The raw material is heated with a burner or by voltage application to the glass. The raw material charged is vitrified in the melter tank usually having a temperature of 1,300° C. to 1,600° C. and then introduced into the refiner having a temperature of 1,400° C. to 1,600° C. In the refiner, the bubbles present in the glass are allowed to come to the surface and removed. The glass discharged from the refiner is cooled during transfer to a forming apparatus through the feeder, and comes to have a viscosity of $10^4$ to $10^6$ dPa·s, which is suitable for forming the glass.

Subsequently, the glass is formed into a tubular shape with a forming apparatus. Usable forming methods include the Danner process, Vello process, down-draw process, and up-draw process. According to need, the tubular glass obtained is redrawn and formed so as to result in a desired tube diameter.

Thereafter, the glass tube is cut into a given size, whereby an outer glass tube for semiconductor encapsulation can be obtained. For cutting such glass tubes, use can be made of a method in which the tubes are cut one by one with a diamond cutter. However, a method in which many glass tubes are cut at a time by binding many glass tubes into one and then cutting the bundle with a diamond wheel cutter is generally employed as a method suitable for mass production.

A method of encapsulating a semiconductor element using the encapsulation material of the invention which has been formed into a tubular shape (outer glass tube) is described below.

First, a semiconductor element, lead wires, and the encapsulation material are set using a jig so that the semiconductor element is sandwiched from both sides between the lead wires in the encapsulation material. Although the material of the lead wires to be used is not limited, base metals readily susceptible to oxidation, such as Dumet, are usable. Thereafter, the whole is heated to a temperature of 1,000° C. or lower to soften and deform the encapsulation material, whereby the element is air-tightly encapsulated. In such a manner, a small electronic part such as a silicon diode, light-emitting diode, or thermistor can be produced.

Besides being used in the form of a tube, the semiconductor encapsulation material of the invention can be used, for example, in the following manner. The encapsulation material is powdered and formed into a paste, which is wound around a semiconductor element and burned to thereby encapsulate the semiconductor element.

Examples

Table 1 shows Examples of the invention (samples Nos. 1 to 9) and Comparative Examples (samples Nos. 10 to 14).

First, a stone powder, alumina, boric acid, lithium carbonate, sodium carbonate, potassium carbonate, potassium nitrate, magnesium oxide, calcium carbonate, strontium carbonate, barium carbonate, zinc oxide, titanium oxide, antimony oxide, zircon, tin oxide, aluminum phosphate, sodium sulfate, sodium chloride, and cerium oxide were mixed together so as to result in a given proportion while taking account of yield ratios and impurity amounts. The resultant mixture was sufficiently mixed by means of a mixer.

The resultant raw material was melted in a glass-melting furnace at 1,500° C. to 1,600° C., formed into a tubular form by the down-draw process, and then cut to obtain glass tubes having an appropriate length (e.g., 1 m). In the case of an encapsulation material for bead thermistors, the inner diameter of the tube is 0.6 to 2.1 mm and the wall thickness is 0.2 to 0.8 mm. The inner diameter and wall thickness of the tube may be controlled by regulating the withdrawal speed of the glass, air pressure, and drawing speed.

Subsequently, several hundred to several thousand of the glass tubes were bound at once with a resin and collectively cut into a length of 1 to 4 mm. Finally, the resin was removed to separate each section into pieces. Thus, tubular encapsulation materials (outer glass tubes) were obtained.

Each sample was examined for thermal expansion coefficient ($\alpha_{30-380}$), density (D), strain point (Ps), temperatures corresponding to $10^4$ dPa·s and $10^5$ dPa·s ($T(10^4)$) and ($T(10^5)$), temperature obtained by subtracting the strain point from the temperature corresponding to $10^4$ dPa·s ($T(10^4)$–Ps), and volume resistivity at 350° C. The results thereof are shown in Table 1.

TABLE 1

|  |  | 1 | 2 | 3 | 4 | 5 | 6 | 7 | 8 | 9 |
|---|---|---|---|---|---|---|---|---|---|---|
| $SiO_2$ | (mol %) | 56.8 | 55.3 | 54.7 | 56.2 | 53.5 | 56.9 | 52.6 | 56.5 | 56.5 |
| $Al_2O_3$ |  | 0.1 | 0.1 | 0.1 | 0.1 | 0.1 | 0.1 | 0.1 | 0.1 | 0.1 |
| $B_2O_3$ |  | 8.1 | 9.9 | 10.2 | 10.2 | 12.8 | 8.8 | 12.6 | 8.1 | 8.1 |
| MgO |  | 6.6 |  | 2.0 | 5.7 | 5.7 | 9.2 | 5.6 | 5.4 | 5.4 |
| CaO |  | 8.8 | 6.9 | 8.5 | 5.6 | 5.6 |  | 5.6 | 7.1 | 7.1 |

TABLE 1-continued

| | | 1 | 2 | 3 | 4 | 5 | 6 | 7 | 8 | 9 |
|---|---|---|---|---|---|---|---|---|---|---|
| SrO | | 9.2 | 7.0 | 8.5 | 5.6 | 5.7 | 9.3 | 5.6 | 7.5 | 7.5 |
| BaO | | 6.2 | 7.0 | 8.5 | 5.7 | 5.7 | 9.7 | 5.6 | 5.1 | 5.1 |
| ZnO | | | | | | | | | | |
| PbO | | | | | | | | | | |
| $Li_2O$ | | | | | | | | | | |
| $Na_2O$ | | 0.6 | 0.6 | 0.6 | 0.6 | 0.6 | 1.2 | 5.2 | 2.3 | 2.3 |
| $K_2O$ | | 3.4 | 8.5 | 5.9 | 8.7 | 8.7 | 4.7 | 5.2 | 6.0 | 5.2 |
| $TiO_2$ | | | | | 0.9 | 0.9 | | 0.9 | 1.8 | 2.6 |
| $ZrO_2$ | | | 4.5 | 0.7 | 0.6 | 0.6 | | 0.9 | | |
| $SnO_2$ | | 0.2 | | | | | | | | |
| $P_2O_5$ | | | 0.2 | | | | | | | |
| $Fe_2O_3$ | | | | | | | | | | |
| $SO_3$ | | | | 0.05 | | | | | | |
| Cl | | | | | | 0.1 | | | 0.1 | |
| $Sb_2O_3$ | | | | | 0.1 | | 0.1 | | | 0.1 |
| $CeO_2$ | | | | 0.25 | | | | 0.1 | | |
| ΣRO | | 30.8 | 20.9 | 27.5 | 22.6 | 22.7 | 28.2 | 22.4 | 25.1 | 25.1 |
| ΣRO: Sr + Ba | | 15.4 | 14.0 | 17.0 | 11.3 | 11.4 | 19.0 | 11.2 | 12.6 | 12.6 |
| ΣR'$_2$O | | 4.0 | 9.1 | 6.5 | 9.3 | 9.3 | 5.9 | 10.4 | 8.3 | 7.5 |
| $K_2O$/ΣR'$_2$O | | 0.85 | 0.93 | 0.91 | 0.94 | 0.94 | 0.80 | 0.50 | 0.72 | 0.69 |
| $\alpha_{30-380}$ | ($10^{-7}$/° C.) | 82.2 | 84.9 | 90.5 | 87.2 | 87.6 | 85.0 | 89.7 | 89.3 | 86.6 |
| D | (g/cm$^3$) | 3.0274 | 3.0606 | 3.0940 | 2.8832 | 2.8869 | 3.0993 | 2.9016 | 2.9354 | 2.9489 |
| Ps | (° C.) | 592 | 588 | 576 | 559 | 556 | 567 | 532 | 555 | 563 |
| T($10^5$) | (° C.) | 893 | 906 | 887 | 860 | 842 | 874 | 810 | 851 | 856 |
| T($10^4$) | (° C.) | 961 | 985 | 949 | 931 | 908 | 947 | 875 | 920 | 924 |
| (T($10^4$) − Ps) | (° C.) | 369 | 397 | 373 | 372 | 352 | 380 | 343 | 365 | 361 |
| Volume resistivity at 350° C. | (Ω-cm) | 12.2 | 10.3 | 11.4 | 10.2 | 10.4 | 11.6 | 9.6 | 10.6 | 10.7 |

| | | 10 | 11 | 12 | 13 | 14 |
|---|---|---|---|---|---|---|
| $SiO_2$ | (mol %) | 65.9 | 64.9 | 53.3 | 56.7 | 68.0 |
| $Al_2O_3$ | | 4.9 | 0.1 | 3.1 | 1.6 | 4.9 |
| $B_2O_3$ | | | | 9.1 | 12.7 | |
| MgO | | 3.4 | | 7.8 | 1.6 | 3.6 |
| CaO | | 2.6 | | 5.6 | 1.2 | |
| SrO | | 6.1 | | 6.1 | 1.3 | 7.4 |
| BaO | | 4.0 | | | 2.2 | 1.2 |
| ZnO | | | | | 5.8 | |
| PbO | | | 29.0 | | | |
| $Li_2O$ | | | | 6.4 | 4.9 | |
| $Na_2O$ | | 5.0 | | 3.1 | 6.6 | 0.8 |
| $K_2O$ | | 5.3 | 5.8 | 5.4 | 5.3 | 8.8 |
| $TiO_2$ | | | | | | |
| $ZrO_2$ | | 2.7 | | | | 5.0 |
| $SnO_2$ | | | | | | |
| $P_2O_5$ | | | | | | |
| $Fe_2O_3$ | | | 0.04 | | | |
| $SO_3$ | | 0.1 | | | | 0.1 |
| Cl | | | | | | |
| $Sb_2O_3$ | | | 0.2 | 0.1 | 0.1 | 0.2 |
| $CeO_2$ | | | | | | |
| ΣRO | | 16.1 | 0.0 | 19.5 | 6.3 | 12.2 |
| ΣRO: Sr + Ba | | 10.1 | 0.0 | 6.1 | 3.5 | 8.6 |
| ΣR'$_2$O | | 10.3 | 5.8 | 14.9 | 16.8 | 9.6 |
| $K_2O$/ΣR'$_2$O | | 0.51 | 1.00 | 0.36 | 0.32 | 0.92 |
| $\alpha_{30-380}$ | ($10^{-7}$/° C.) | 83.7 | 92.0 | 92.3 | 93.3 | 72.6 |
| D | (g/cm$^3$) | 2.82 | 4.31 | 2.6769 | 2.7092 | 2.7481 |
| Ps | (° C.) | 582 | 390 | 473 | 455 | 691 |
| T($10^5$) | (° C.) | 1034 | 727 | 706 | 747 | 1174 |
| T($10^4$) | (° C.) | 1150 | 820 | 840 | 825 | 1291 |
| (T($10^4$) − Ps) | (° C.) | 568 | 430 | 367 | 370 | 600 |
| Volume resistivity at 350° C. | (Ω-cm) | 7.8 | 9.6 | 7.2 | 7.7 | 7.9 |

As apparent from Table 1, samples Nos. 1 to 9, which are Examples of the invention, had a strain point of 532° C. or higher and hence excellent in heat resistance. Furthermore, the thermal expansion coefficients of these samples were $82.2 \times 10^{-7}$ to $90.5 \times 10^{-7}$/° C., and the temperatures thereof corresponding to $10^4$ dPa·s were 985° C. or lower. These samples were found to be suitable for the coating or encapsulation of Dumet.

The property evaluation of each sample was conducted in the following manner. First, raw glass materials were mixed so as to result in the composition shown in Table 1 and melted at a temperature in the range of 1,500° C. to 1,600° C. for 6 hours with a platinum crucible. Thereafter, the melt was formed and processed into a given shape and then subjected to the evaluation of each property. In each sample, the content of $Fe_2O_3$ was 150 to 250 ppm.

The thermal expansion coefficient was determined by processing each glass into a cylinder having a diameter of about 5 mm and a length of about 20 mm and then examining this cylinder for average thermal expansion coefficient in the temperature range of 30 to 380° C. with an automatic differential dilatometer.

The density was determined by the Archimedes method.

The strain point and the temperatures corresponding to viscosities of $10^4$ dPa·s and $10^5$ dPa·s were determined in the following manner. First, the strain point of each glass was measured by the fiber method in accordance with ASTM C338, and the temperatures corresponding to viscosities of $10^4$ dPa·s and $10^{2.5}$ dPa·s were measured by the platinum ball pulling-up method. Furthermore, these values of temperature and viscosity were substituted into the Fulcher equation to calculate the temperature at which the viscosity reached $10^5$ dPa·s.

The volume resistivity at 350° C. was measured by the method in accordance with ASTM C657.

While the present invention has been described in detail and with reference to specific embodiments thereof, it will be apparent to one skilled in the art that various changes and modifications can be made therein without departing from the spirit and scope thereof.

The present application is based on Japanese Patent Application No. 2008-165700 filed on Jun. 25, 2008, and the contents thereof are incorporated herein by reference.

What is claimed is:

1. A semiconductor encapsulation material comprising a glass for metal encapsulation which has a strain point of 480° C. or higher, a temperature corresponding to a viscosity of $10^4$ dPa·s of 1,100° C. or lower, and a thermal expansion coefficient at 30 to 380° C. of $70 \times 10^{-7}$ to $110 \times 10^{-7}$/° C., wherein content of $B_2O_3$ in the glass for metal encapsulation is 5 to 21% by mole.

2. The semiconductor encapsulation material according to claim 1, wherein the glass for metal encapsulation is composed of an $SiO_2$—$B_2O_3$—RO—$R'_2O$ glass in which R is one or more members selected from Mg, Ca, Sr, and Ba; and R' is one or more members selected from Li, Na, and K.

3. The semiconductor encapsulation material according to claim 2, wherein the content of RO in the glass for metal encapsulation is 10% by mole or higher.

4. The semiconductor encapsulation material according to claim 2, wherein the content of $R'_2O$ in the glass for metal encapsulation is 1 to 20% by mole.

5. The semiconductor encapsulation material according to claim 2, wherein the content of $Li_2O$ in the glass for metal encapsulation is 6% by mole or lower.

6. The semiconductor encapsulation material according to claim 2, wherein the content of $K_2O$ in the glass for metal encapsulation is 2% by mole or higher.

7. The semiconductor encapsulation material according to claim 2, wherein the content of $K_2O$ is highest among the contents of the $R'_2O$ components in the glass for metal encapsulation.

8. The semiconductor encapsulation material according to claim 2, wherein the content of $Li_2O$ is lowest among the contents of the $R'_2O$ components in the glass for metal encapsulation.

9. The semiconductor encapsulation material according to claim 1, wherein the content of $B_2O_3$ in the glass for metal encapsulation is 5 to 18% by mole.

10. The semiconductor encapsulation material according to claim 1, which is used for the encapsulation of a semiconductor element and a metallic lead wire.

11. A semiconductor encapsulation material according to claim 1, wherein the glass for metal encapsulation comprises, in terms of % by mole, 40 to 75% of $SiO_2$, 0 to 8% of $Al_2O_3$, 5 to 14% of $B_2O_3$, 10 to 45% of RO (wherein R is one or more members selected from Mg, Ca, Sr, and Ba), 0 to 20% of MgO, 0 to 20% of CaO, 0 to 35% of SrO, 1 to 35% of BaO, 1 to 20% of $R'_2O$ (wherein R' is one or more members selected from Li, Na, and K), 0 to 6% of $Li_2O$, 0 to 12% of $Na_2O$, and 2 to 15% of $K_2O$.

12. The semiconductor encapsulation material according to claim 11, wherein the content of $K_2O$ is highest among the contents of the $R'_2O$ components in the glass for metal encapsulation.

13. The semiconductor encapsulation material according to claim 11, wherein the content of $Li_2O$ is lowest among the contents of the $R'_2O$ components in the glass for metal encapsulation.

14. The semiconductor encapsulation material according to claim 11, which is used for the encapsulation of a semiconductor element and a metallic lead wire.

15. A method for semiconductor encapsulation which comprises encapsulating a semiconductor element and a metallic lead wire with the semiconductor encapsulation material according to claim 1.

16. The method for semiconductor encapsulation according to claim 15, wherein the lead wire is made of a base metal.

17. The method for semiconductor encapsulation according to claim 15, wherein the lead wire is made of Dumet.

18. The method for semiconductor encapsulation according to claim 15, wherein the semiconductor element is a thermistor chip.

19. The method for semiconductor encapsulation according to claim 15, wherein the encapsulation is conducted at a temperature of 1,000° C. or lower.

* * * * *